United States Patent [19]

Horninger

[11] 4,412,139
[45] Oct. 25, 1983

[54] INTEGRATED MOS DRIVER STAGE WITH A LARGE OUTPUT SIGNAL RATIO

[75] Inventor: Karlheinrich Horninger, Eglharting, Fed. Rep. of Germany

[73] Assignee: Siemens Aktiengesellschaft, Berlin & Munich, Fed. Rep. of Germany

[21] Appl. No.: 270,342

[22] Filed: Jun. 4, 1981

[30] Foreign Application Priority Data

Jul. 16, 1980 [DE] Fed. Rep. of Germany ....... 3026951

[51] Int. Cl.³ .......................... H03K 3/01; H03K 17/60
[52] U.S. Cl. ....................................... 307/270; 307/581
[58] Field of Search ............... 307/270, 448, 571, 450, 307/482, 251, 584, 578, 577

[56] References Cited

U.S. PATENT DOCUMENTS

| | | | |
|---|---|---|---|
| 3,629,618 | 12/1971 | Fujimoto | 307/270 |
| 3,700,981 | 10/1972 | Masuhara et al. | 307/450 |
| 3,775,693 | 11/1973 | Proebsting | 307/450 |
| 3,903,431 | 9/1975 | Heeren | 307/482 |
| 3,995,172 | 11/1976 | Freeman et al. | 307/450 |
| 4,063,117 | 12/1977 | Laugesen et al. | 307/482 |
| 4,129,794 | 12/1978 | Dickson et al. | 307/482 |
| 4,195,352 | 3/1980 | Tu et al. | 307/450 |
| 4,264,829 | 4/1981 | Misaizu | 307/450 |
| 4,296,339 | 10/1981 | Murotani | 307/450 |

OTHER PUBLICATIONS

Knepper, "Dynamic Depletion Mode: An E/D MOSFET Circuit Method for Improved Performance;" IEEE Journal of Solid-State Circuits, vol. SC-13, No. 5, Oct. 1978, pp. 542-548.

Primary Examiner—John S. Heyman
Assistant Examiner—Timothy P. Callahan
Attorney, Agent, or Firm—Hill, Van Santen, Steadman & Simpson

[57] ABSTRACT

A driver stage formed in integrated MOS technology has a large output signal ratio but with reduced idle currents. First and second control stages are provided of MOSFETs series connected and with their outputs between the MOSFETs connecting to respective gates of an output stage also comprised of series connected MOSFETs. In the output stage, one of the MOSFETs has its channel resistance reduced and is parallel-connected with an additional MOSFET. A boot strap capacitor connects between a gate of the additional MOSFET and an output of the circuit.

4 Claims, 3 Drawing Figures

INTEGRATED MOS DRIVER STAGE WITH A LARGE OUTPUT SIGNAL RATIO

BACKGROUND OF THE INVENTION

The present invention concerns a driver stage in integrated MOS circuitry technology with a large output signal ratio whereby as a control stage and as an output stage, in each case, series circuits of a first and a second MOSFET are provided lying between the supply voltage terminal and functioning as a source follower or, respectively, an inverter.

From R. W. Knepper: "Dynamic Depletion Mode: An E/D MOSFET Circuit Method for Improved Performance," IEEE J. of Solid State Circuits, October 78, Vol. SC-13, No. 5, pp. 542-548, incorporated herein by reference, a driver stage of the named above described type is known whereby the second MOSFET lying in each case at ground potential is embodied as an enrichment type and the first MOSFET in each case is embodied as a depletion type. In each case the common connection point between the first and the second MOSFET of the control stage or, respectively, of the output stage forms the signal output of the respective stage. In each case the signal output of one of the control stages is connected with the gate of the first or, respectively, second MOSFET of the inverter of the output stage. The signal output of the inverter of the output stage corresponds to the output of the driver stage. This known circuitry arrangement is provided with a large output signal ratio in comparison to earlier known driver stages. This improved driver stage compared to earlier known driver stages has, however, the disadvantage that in one of its operating states it causes a relatively high current consumption and thus a relatively high power dissipation.

SUMMARY OF THE INVENTION

It is an object of the present invention to create a driver stage of the kind named which, despite the large output signal ratio desired, has a significantly smaller power dissipation.

The problem forming the basis of the invention is solved by means of a driver stage wherein the first MOSFET of the control stage (the input) is designed as an enhancement type. In the output stage, an additional MOSFET enhancement type transistor has its gate, source and drain parallel connected with the gate, source and drain of the depletion type MOSFET of the output stage. In addition a boot strap capacitor is connected between a gate of this additional transistor and the connection point between the first and second transistors of the output stage. Also, the W/L (width-to-length ratio) of the first transistor in the output stage (depletion type MOSFET) is reduced in size with respect to the W/L ratio of the additional enhancement type MOSFET.

This new driver stage is characterized according to the invention in that the first output stage MOSFET which is embodied as a depletion type has associated with it a MOSFET embodied as an enhancement type and which is parallel-connected thereto with regard to source, drain and gate. Between the gates of the two parallel-connected MOSFET's, namely, of the first output stage MOSFET and of the parallel-connected MOSFET, a boot strap capacitor is connected to the connection point between these and to the second output stage MOSFET, namely, to the output of the driver stage. The W/L (width/length ratio of channel) ratio of the first output stage MOSFET is reduced in size with respect to that of the corresponding MOSFET of the known driver stage. The W/L ratio of the parallel-connected MOSFET is designed large with respect to that of the first output stage MOSFET. Finally, the first MOSFET of the control stage embodied as a depletion type and whose signal output is connected with the gates of the first output stage MOSFET and of the parallel-connected additional MOSFET is replaced by a first control stage MOSFET embodied as an enhancement type.

The present invention offers the advantage that an integrated MOS technology driver stage with a large output signal ratio has been created which in its first or, respectively, in its second operating state has a lower power dissipation in comparison to the above described known driver stage. This again brings with it the advantage that otherwise-existing heat problems of a known kind no longer appear in the case of such driver stages of this invention.

DESCRIPTION OF THE PREFERRED EMBODIMENTS

Figure 1:
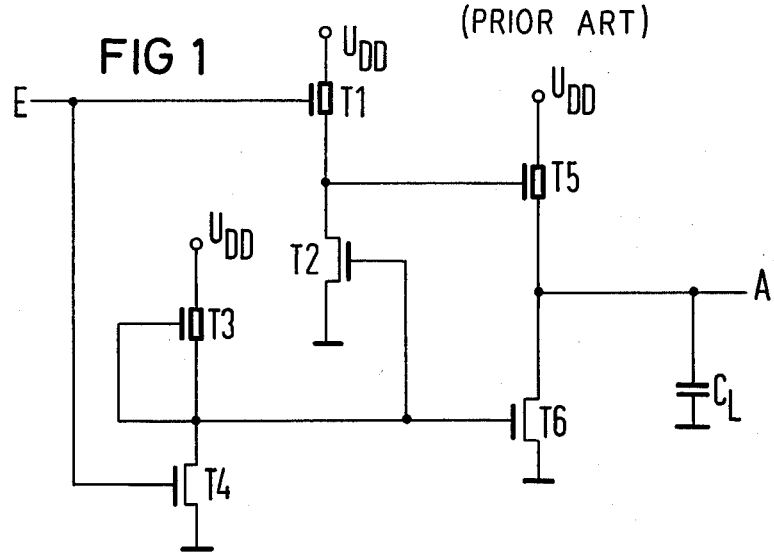
FIG. 1 shows a schematic diagram of a driver stage of the prior art.

As was already explained, FIG. 1 shows the connection diagram of the prior art driver stage. It comprises a first control stage with a first MOSFET T1 embodied as a depletion type and a second MOSFET T2 embodied as an enhancement type. A second control stage with a third MOSFET T3 is provided embodied as a depletion type and a fourth MOSFET T4 is embodied as an enhancement type. An output stage is provided with a fifth MOSFET T5 embodied as a depletion type and a sixth MOSFET T6 shown embodied as an enhancement type. The two control stages and the output stage are in each case designed to operate as a source follower or, respectively, as an inverter, between the operating voltage terminals $U_{DD}$ and ground. The input E of this driver stage is connected with the gate of the first MOSFET T1 and with the gate of the fourth MOSFET T4. The connection point between the source of the first MOSFET T1 and the drain of the second MOSFET T2 is connected with the gate of the fifth MOSFET T5. The connection point between the source of the third MOSFET T3 and the drain of the fourth MOSFET T4 is connected with the gate of the third MOSFET T3, with the gate of the second MOSFET T2, and with the gate of the sixth MOSFET T6. The connection point between the source of the fifth MOSFET T5 and the drain of the sixth MOSFET T6 represents the output A of the driver stage which is provided with a capacitive load $C_L$. In these switching stages where one of the stages at the connection point of the corresponding MOSFET has the potential 0, an idle current flows through the corresponding stage from the operating voltage source $U_{DD}$ toward ground. Since the output stage, which in this case is comprised of the fifth MOSFET T5 and the sixth MOSFET T6, has transistors with relatively small channel resistance, the idle current described is disadvantageously large, which leads to an undesirably high power dissipation.

Figure 2:
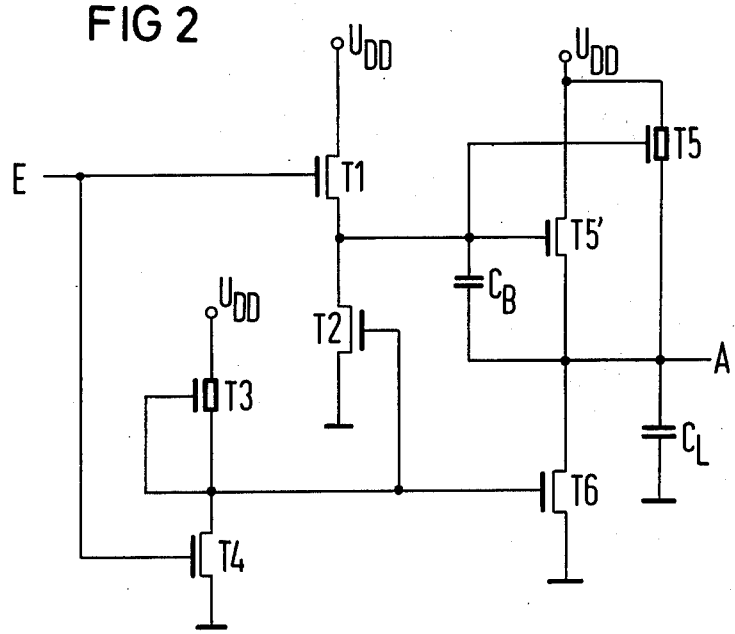
FIG. 2 shows the schematic diagram of a first embodiment of a driver stage according to the invention.

As was already explained, FIG. 2 shows the connection diagram of a first embodiment for the inventive driver stage. It differs in its circuit structure from the known driver stage in that associated with the first output stage MOSFET T5 embodied as a depletion type, is a MOSFET T5' embodied as an enhancement type. It is parallel-connected with respect to source, drain and gate. Between the gates of the two parallel-connected MOSFET's, namely of the first output stage MOSFET T5 and of the parallel-connected MOSFET T5', and the connection point between these and the second output stage MOSFET T6 (the output A of the driver stage), a boot strap capacitor $C_B$ is connected. The W/L ratio of the parallel-connected MOSFET T5' is designed large in comparison to the first output stage MOSFET T5. The first MOSFET, embodied as a depletion type (of the stage whose signal output is connected with the gates of the first output stage MOSFET T5 and of the parallel-connected MOSFET T5') is replaced by a first control stage MOSFET T1 embodied as an enhancement type.

By means of the inventive structure of the driver stage, it is now assured in an advantageous manner that in neither of the two possible static switching states of the individual stages of the driver stage does a disadvantageously large power dissipation occur. This will be explained below by use of an explanation of the potential states at the individual nodes of the inventive circuit arrangement corresponding to the different possible static switching states.

Case 1 (Input E lies at 0 Volts):

When the input E lies at 0 potential, the first MOSFET T1 of the first control stage is blocked. Also, the lower MOSFET of the second control stage, namely, the fourth MOSFET T4 is blocked. For this reason, the connection point between the two MOSFET's of the second control stage, namely, T3 and T4, lies at the operating voltage potential $U_{DD}$, for example, +5 volts. This results since the MOSFET T3 embodied as a depletion type is connected as a load element. This potential is then present at the gate of the second MOSFET T2 of the first control stage and the gate of the second output stage MOSFET T6. The two last-named MOSFET's are, as a result of this, turned on so that both the connection point between the MOSFET's T1 and T2 and the connection point between the MOSFET's T5 or, respectively, T5', and the MOSFET T6 in each case lie at the potential 0. Since the first MOSFET T1 of the first control stage is blocked, no current flows through this MOSFET. Also, no current flows through the MOSFET T3. Only through the first output stage MOSFET T5 does a small current flow via the second output stage MOSFET T6 toward ground. The small value of this current is determined by the high resistance of the MOSFET T5. Thus, a low power dissipation arises.

Case 2 (Input E lies at a high potential, for example, +5 Volts): In this case, the first MOSFET T1 of the first control stage and the lower MOSFET of the second control stage, namely, T4, are turned on. Therefore, at the connection point between the MOSFET T1 and the MOSFET T2 there lies a potential of $5-U_T$ which also passes through to the gate of the parallel-connected MOSFET T5'. The connection point between the MOSFET's T3 and T4 in this case lies at 0 volts, which potential in each case allocates itself to the gate of the MOSFET T2 or, respectively, of the MOSFET T6.

The two last-named MOSFET's thereby remain blocked so that the first-mentioned potential of the connection point between T1 and T2 is maintained. Via the boot strap capacitor $C_B$, the gate voltage of the MOSFET T5' in a manner known per se is coupled to a high voltage as a result of the operating voltage $U_{DD}$. Accordingly, the full operating voltage $U_{DD}$ arrives at the output A. Since this is a dynamic effect, after a specific time the output would again sink to a potential $U_{DD}-U_T$. However, this impedes the MOSFET T5 lying parallel to T5'. As was already explained, T5 is of the depletion type. It holds the output A at the potential $U_{DD}$. Since the W/L ratio of this MOSFET is kept small, that is, the channel resistance is large, a slight current flows which does not contribute to the total power dissipation to an extent worthy of mention.

Figure 3:
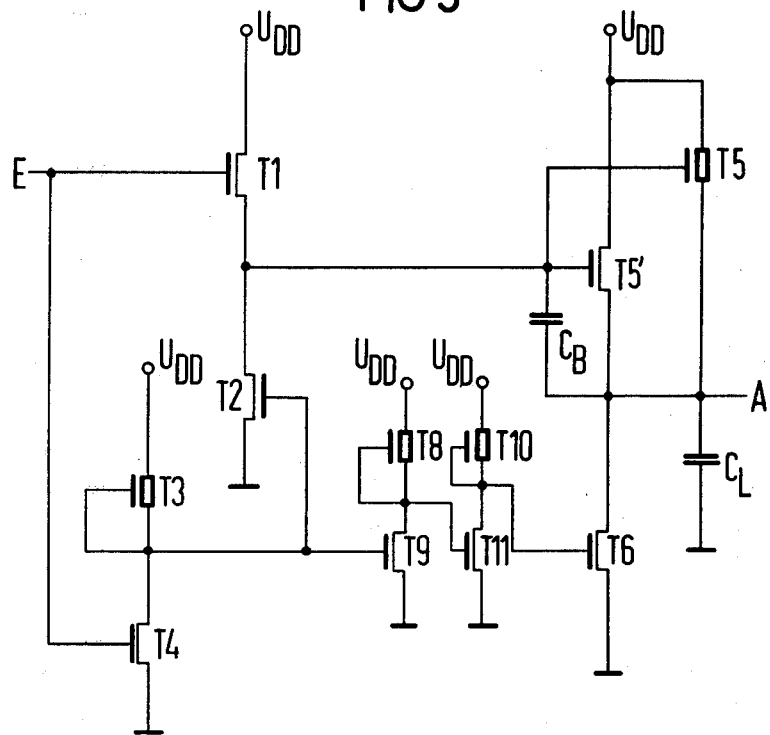
FIG. 3 shows the schematic diagram of an improved embodiment for the driver stage of the invention.

An improvement of the characteristics of the inventive driver stage can be attained in that between the gate of MOSFET T2 of the first control stage (signal output which acts on the gate of the second output stage MOSFET T6) and the gate of the second output stage MOSFET T6 there are arranged two auxiliary inverter stages which are formed of in each case a first auxiliary MOSFET T8 or, respectively, T10 embodied as a depletion type, and in each case a second auxiliary MOSFET T9 or, respectively, T11 embodied as an enhancement type. These serially arranged inverters delay the signal which comes from the second control stage (consisting of the MOSFET T3 and T4) whereby the signal is placed in delayed fashion at the gate of the MOSFET T6 (compare FIG. 3). By means of this improvement, a steeper leading edge is obtained for the control signal at the gate of the parallel-connected MOSFET T5'. In any case, a somewhat higher switching delay time is accepted.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. A driver stage formed in integrated MOS technology and which has a large output signal ratio, comprising: a first control stage comprising first and second series connected MOSFETs, both of which are of the enhancement type, and with an input at the first MOSFET and an output between the two MOSFETs; a second control stage having first and second MOSFETs, one of which is connected to said input and an output being provided between the two MOSFETs; an output stage comprising a first depletion type MOSFET and a second series connected enhancement type MOSFET with an output connecting between the two, the output of the first control stage connecting to a gate of the first MOSFET and the output of the second control stage connecting to a gate of the second MOSFET; an additional enhancement type MOSFET in the output stage whose source, drain and gate are parallel-connected with the respective source, drain and gate of the first MOSFET of the output stage; a boot strap capacitor connected between the gate of the additional MOSFET and a connection point between the additional MOSFET and second MOSFET of the output stage; a W/L (width-to-length) ratio of the channel of the first MOSFET of the output stage being reduced in size with respect to the W/L ratio of the additional MOSFET, whereby a channel resistance of the output stage first MOSFET is reduced; and between the second control stage signal output acting upon the gate of the second output stage MOSFET and the gate of the second output stage MOSFET there being directly connected two auxiliary inverter stages directly serially connected and each of which is formed of a first auxiliary MOSFET of a depletion type and a second auxiliary MOSFET of an enhancement type.

2. A driver stage according to claim 1 wherein the second control stage first MOSFET is of the depletion type and has its gate connected to its source, and wherein the second MOSFET of the same stage is of the enhancement type.

3. A driver stage according to claim 1 wherein the input of the driver stage connects to a gate of the first MOSFET of the first control stage and the second MOSFET of the second control stage, and wherein in each of the control stages and output stage the first MOSFETs have their drains connected to a positive voltage source and the second MOSFETs have their sources connected to a reference potential.

4. A driver stage according to claim 3 wherein a gate of the first control stage MOSFET connects with a gate of the second MOSFET of the output stage.

* * * * *